(12) United States Patent
Gustaf

(10) Patent No.: US 11,722,325 B2
(45) Date of Patent: Aug. 8, 2023

(54) MODULAR POWER SUPPLY SYSTEM

(71) Applicant: Trango Networks, LLC., Random Lake, WI (US)

(72) Inventor: Christopher A. Gustaf, San Diego, CA (US)

(73) Assignee: Trango Networks, LLC, Random Lake, WI (US)

( * ) Notice: Subject to any disclaimer, the term of this patent is extended or adjusted under 35 U.S.C. 154(b) by 115 days.

(21) Appl. No.: 17/346,977

(22) Filed: Jun. 14, 2021

(65) Prior Publication Data
US 2021/0391711 A1 Dec. 16, 2021

Related U.S. Application Data

(60) Provisional application No. 63/039,719, filed on Jun. 16, 2020.

(51) Int. Cl.
*H04L 12/10* (2006.01)
*H02H 7/20* (2006.01)
*G05F 1/46* (2006.01)
*H04Q 9/04* (2006.01)
*G01R 19/165* (2006.01)
(Continued)

(52) U.S. Cl.
CPC .............. *H04L 12/10* (2013.01); *G01R 15/18* (2013.01); *G01R 19/16571* (2013.01); *G05F 1/46* (2013.01); *G06F 1/26* (2013.01); *H02H 7/20* (2013.01); *H04L 7/10* (2013.01); *H04Q 9/04* (2013.01); *H04Q 2209/88* (2013.01)

(58) Field of Classification Search
CPC .......... H04L 12/10; H04L 7/10; G01R 15/18; G01R 19/16571; G05F 1/46; H02H 7/20; H04Q 9/04; H04Q 2209/88; G06F 1/26
See application file for complete search history.

(56) References Cited

U.S. PATENT DOCUMENTS

2004/0164619 A1* 8/2004 Parker .................... H04L 12/10
307/80
2006/0063509 A1* 3/2006 Pincu .................... H04L 12/10
455/67.11
(Continued)

OTHER PUBLICATIONS

International Search Report and Written Opinion, PCT/US2021/059108 dated Feb. 24, 2022, 13 pages.

*Primary Examiner* — Ryan Johnson
(74) *Attorney, Agent, or Firm* — Nelson Mullins Riley & Scarborough LLP; Anthony A. Laurentano

(57) ABSTRACT

A power supply system that includes a pluggable and replaceable modular power interface card and a separate main chassis component that can include AC to DC power conversion and regulation circuitry, a digital voltage display, and one or more card slots for receiving the power supply card. The modular power interface card can provide power to a network device that is connected thereto. The modular power interface card can include an isolation and protection unit that includes a voltage suppression subunit and a high voltage protection subunit, fusing, and a path to earth ground. The modular power interface card plugs into the main chassis and can be quickly replaced in the event of damage or failure, and can include light emitting diodes (LEDs) to indicate whether the remote device being powered is consuming current, which is useful during troubleshooting.

28 Claims, 3 Drawing Sheets

(51) Int. Cl.
*G01R 15/18* (2006.01)
*H04L 7/10* (2006.01)
*G06F 1/26* (2006.01)

(56) References Cited

U.S. PATENT DOCUMENTS

2006/0082222 A1 4/2006 Pincu et al.
2011/0169331 A1 7/2011 Gill et al.
2020/0274725 A1* 8/2020 Sironi .................... H01H 83/22

* cited by examiner

MODULAR POWER SUPPLY SYSTEM

RELATED APPLICATION

The present application claims priority to U.S. provisional patent application Ser. No. 63/039,719, entitled MODULAR POWER SUPPLY SYSTEM, filed on Jun. 16, 2020, the contents of which are herein incorporated by reference.

BACKGROUND OF THE INVENTION

The present invention generally relates to modularization of a power supply system for use with networking devices, such as wireless Access Points (APs), microwave transmission systems, routers and network switches that utilize Power over Ethernet (PoE) or direct current (DC) power inputs. These devices are typically located in outdoor environments or located on towers and require protection from electrical surges and lightning.

Conventional power supply systems for microwave transmission systems exist and are widely utilized. The conventional power supply systems can be mounted, for example, to cell towers and the like. The power supply systems are configured to supply needed power to selected power transmission components of the microwave system. The conventional power supplies are specially configured and are designed to operate with specific main chassis. Hence, if the power supply system fails for some reason, then the entire power system unit needs to be replaced. These systems are expensive to replace, and thus the operator or installer needs to keep many different types of complete power systems in stock in the case of failure of the power system.

SUMMARY OF THE INVENTION

The present invention simplifies the installation and maintenance of a power supply for power supply systems by utilizing a pluggable and replaceable modular power interface card and a separate main chassis that can include AC to DC power conversion and regulation circuitry, a digital voltage display, and one or more card slots for receiving the power supply card. The modular power interface card can provide power to a network device that is connected thereto. The modular power interface card of the present invention is low cost, can include an isolation and protection unit that includes a voltage suppression subunit and a high voltage protection subunit, fusing, and a path to earth ground. The modular power interface card plugs into the main chassis and can be quickly replaced in the event of damage or failure, and can include light emitting diodes (LEDs) to indicate whether the remote device being powered is consuming current, which is useful during troubleshooting. Due to the different wiring between different system equipment makers, it is possible to have a single main chassis design that supports many different power supply cards, thus making system maintenance much simpler while reducing cost. The power supply card of the present invention can attach to the main chassis by sliding into a card edge electrical connector and then being secured with one or more captive finger tightened screws.

The main chassis can include connections to the main power supply and a back-up power supply and a power conversion unit with an associated adjustment unit for adjusting the output voltage/power supplied by the main chassis to the power supply card. The back-up power supply (e.g., a battery) can provide power in the event of an AC power failure or interruption. A digital voltage display can be employed to indicate the actual voltage being provided to the power supply card and hence to the remote device, whether it is the main power supply or the backup power supply. If the internal or main power supply voltage is higher in magnitude than the backup power supply voltage, then the internal power output is used and hence displayed on the display. Any interruptions to either the AC main power supply or the battery power supply do not affect the connected powered device.

The present invention is directed to a modular power supply system for supplying power to a connected device comprising a power interface card and a main chassis component. The power interface card includes an identification logic module for storing identification data associated with the power interface card; a fuse element for providing over-current protection from a working voltage; a current sensor unit for detecting current supplied to the power interface card and for generating a sensor output signal representative of a working voltage level of the working voltage; a voltage regulator unit for generating in response to the working voltage a threshold signal; a threshold detection unit coupled to the current sensor unit and to the voltage regulator unit for comparing the sensor output signal to the threshold signal, wherein the threshold detector unit generates a detection output signal when a value associated with the sensor output signal is greater than a value associated with the threshold signal; a first LED coupled to an output of the threshold detection unit and is configured to be actuated in response to the detection output signal, wherein the first LED when actuated is indicative of power being supplied by the power interface card; a transformer unit coupled to the current sensor unit for receiving the working voltage and for electrically isolating a connected device from the working voltage while providing power thereto; and an isolation and protection unit for protecting the power supply subsystem from selected types of voltage events.

The main chassis component for supplying the working voltage to the power interface card includes an identification module for receiving the identification data from the identification logic module and for generating a power control signal; a power conversion module for converting power supplied by a main power source to the working voltage, wherein the power conversion module in response to the power control signal outputs the working voltage at the selected working voltage level; a display driver for sensing the working voltage level of the power interface card; and a display coupled to the display driver for displaying the working voltage level. The power interface card is removably and replaceably coupled to the main chassis component.

The power supply system of claim 1, wherein the main chassis component further comprises a voltage adjustment unit coupled to the power conversion module for adjusting the working voltage level generated by the power conversion module. The main chassis component can also include a sync pulse driver module configured for receiving a receiver output signal and in response generating a sync output signal that is coupled to the transformer unit of the power interface card for placing a pulse signal on an output of the transformer so as to enable the power interface card to synchronize one or more signals of one or more radio transmitters within a selected distance of the power interface card. The identification data can include working voltage level requirements and ground voltage level requirements.

According to an aspect of the present invention, the power interface card can include an input power combination unit configured so as to receive and combine power supplied from a main power source and a back-up power source via the main chassis component. The input power combination unit can include a first Schottky barrier diode configured so as to be coupled to the power supplied by the back-up power source and a second Schottky barrier diode configured so as to be coupled to the power supplied by the main power source.

The power interface card can further include a second LED unit coupled to the current sensor unit, where the second LED is actuatable when power is supplied to the connected device. The second LED unit can employ an input biasing resistor. Further, the threshold detector unit comprises an operational amplifier, and the transformer unit has a center tap that is coupled to the current sensor unit.

The isolation and protection unit comprises a voltage suppression subunit for protecting the power supply subsystem from a low voltage type event, and a high voltage protection subunit for protecting the power supply subsystem from a high voltage type event. The low voltage type event includes a static charge, and the high voltage type event includes a lightning strike. The voltage suppression subunit comprises a plurality of connected voltage suppression diodes for suppressing the low voltage type event, and the high voltage protection subunit comprises a plurality of connected gas discharge tubes to perform the voltage protection.

The present invention is also directed to a modular power interface card suitable for use with a power supply system for supplying a working voltage to a connected device. The power interface card includes an identification logic module for storing identification data associated with the power interface card; a fuse element for providing over-current protection from the working voltage; a current sensor unit for detecting current supplied to the power interface card and for generating a sensor output signal representative of a working voltage level of the working voltage; a voltage regulator unit for generating in response to the working voltage a threshold signal; a threshold detection unit coupled to the current sensor unit and to the voltage regulator unit for comparing the sensor output signal to the threshold signal, wherein the threshold detection unit generates a detection output signal when a value associated with the sensor output is greater than a value associated with the threshold signal; a first LED coupled to an output of the threshold detection unit and is configured to be actuated in response to the detection output signal, wherein the first LED when actuated is indicative of power being supplied by the power interface card; a transformer unit coupled to the current sensor unit for receiving the working voltage and for electrically isolating the connected device from the working voltage; and an isolation and protection unit for protecting the power supply subsystem from selected voltage events. The identification data can include working voltage level requirements and ground voltage level requirements.

The power interface card can also include an input power combination unit configured so as to receive and combine power that is received by the subsystem. The input power combination unit includes a first Schottky barrier diode configured so as to be coupled to power supplied by a back-up power source and a second Schottky barrier diode configured so as to be coupled to power supplied by a main power source.

According to another aspect, the power interface card includes a voltage LED unit coupled to the current sensor unit, where the voltage LED is actuatable when power is supplied thereto. The threshold detection unit comprises an operational amplifier. Further, the transformer unit has a center tap that is coupled to the current sensor unit.

The isolation and protection unit comprises a voltage suppression subunit for protecting the power supply subsystem from a low voltage event, and a high voltage protection subunit for protecting the power supply subsystem from a high voltage event. The low voltage event includes a static charge, and the high voltage event includes a lightning strike. The voltage suppression subunit comprises a plurality of connected voltage suppression diodes for suppressing the low voltage event, and the high voltage protection subunit comprises a plurality of connected gas discharge tubes to perform the voltage protection.

The present invention is further directed to a main chassis component of a power supply system for supplying a working voltage to a connected device. The main chassis component includes an identification module for receiving identification data associated with an attached power interface card and for generating a power control signal; a power conversion module for converting power supplied by a main power source to the working voltage, wherein the power conversion module in response to the power control signal outputs the working voltage at a selected working voltage level; a display driver for sensing the working voltage level of the power supply subsystem; and a display coupled to the display driver for displaying the working voltage level.

The main chassis component can further include a voltage adjustment unit coupled to the power conversion module for adjusting the working voltage level generated by the power conversion module. The main chassis component can also include a sync pulse driver module configured for receiving a receiver output signal and in response generating a sync output signal that is configured to be coupled to a transformer for placing a pulse signal on an output of the transformer so as to synchronize one or more radio transmitters within a selected distance of the main chassis component.

BRIEF DESCRIPTION OF THE DRAWINGS

These and other features and advantages of the present invention will be more fully understood by reference to the following detailed description in conjunction with the attached drawings in which like reference numerals refer to like elements through the different views. The drawings illustrate principals of the invention and, although not to scale, show relative dimensions.

DETAILED DESCRIPTION

Figure 1:
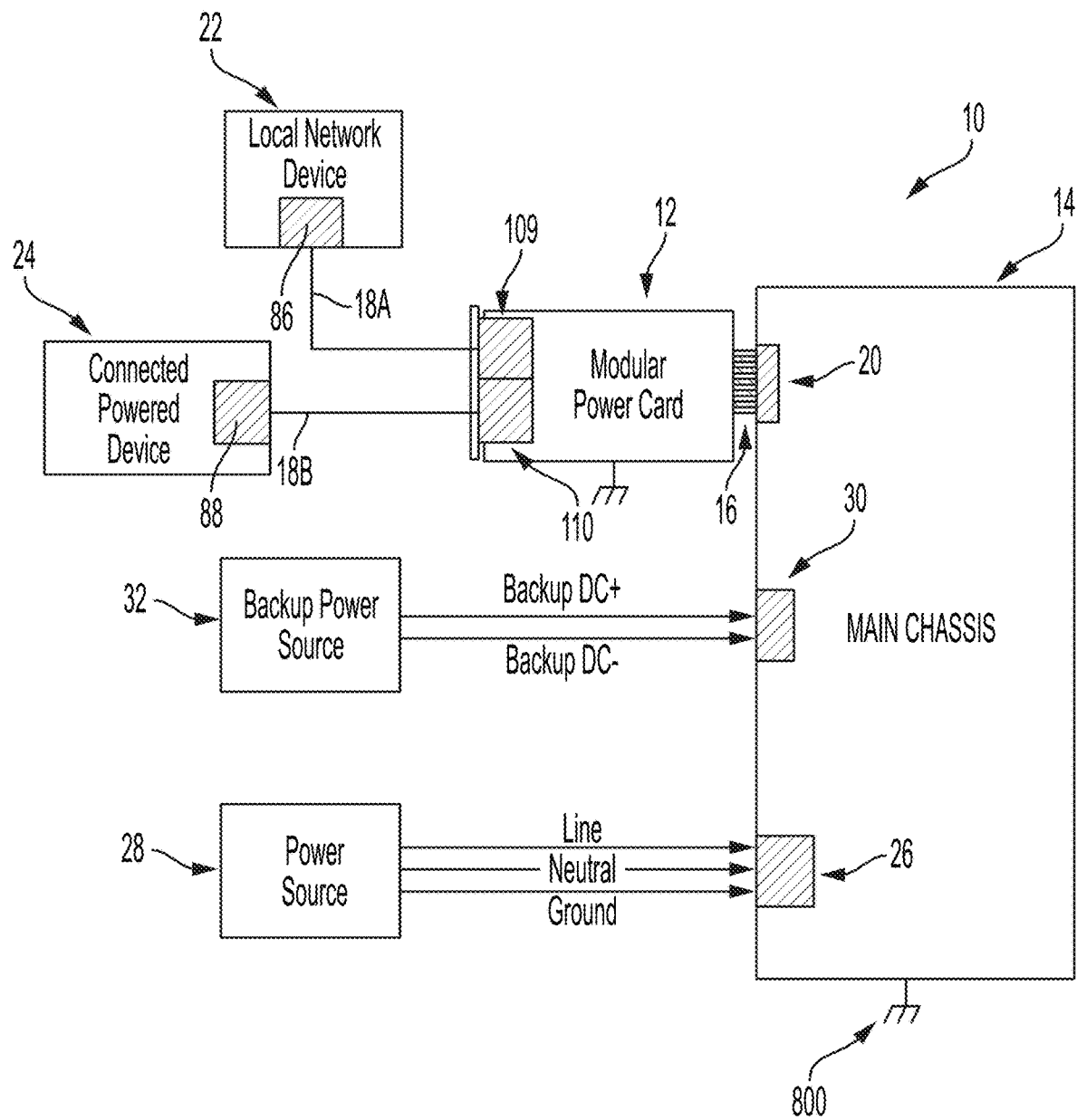
FIG. 1 is a schematic system level block diagram of the modular power supply system of the present invention showing the external power sources, the main chassis, a pluggable modular power interface card, and one or more remote powered devices connected to the system.

The present invention is directed to a modular power supply system 10 having a power interface card 12 that can be electrically connected to a main chassis component 14. The modular power interface card 12 can be coupled to the main chassis 14 using an electrical interconnect 16, which can be for example gold plated finger interconnections, that is coupled to a power subsystem connector 20. The illustrated power interface card 12 can be configured as a modular, pluggable power supply card or module that provides a voltage via a selected electrical connection 18A to a local network device 22 and via a selected electrical connection 18B to a connected powered device 24. The network devices 22 can include for example networks routers and switches and the powered devices 24 can include for example power-over-ethernet (POE) microwave radios, Wi-Fi access points, cameras, and the like. The electrical connectors 18A, 18B can be any suitable connector, such as for example a Cat5 shielded twisted pair cable. The illustrated main chassis 14 can include a power connector 26 that can be configured for connection to a main power source 28, such as an alternating current (AC) power source. The main power source 28 can supply a voltage in the range of between about 110 VAC and about 240 VAC to the main chassis 14. The main chassis 14 also includes a back-up power connector 30 that is configured to be placed in electrical connection with a back-up power source 32.

Figure 2:
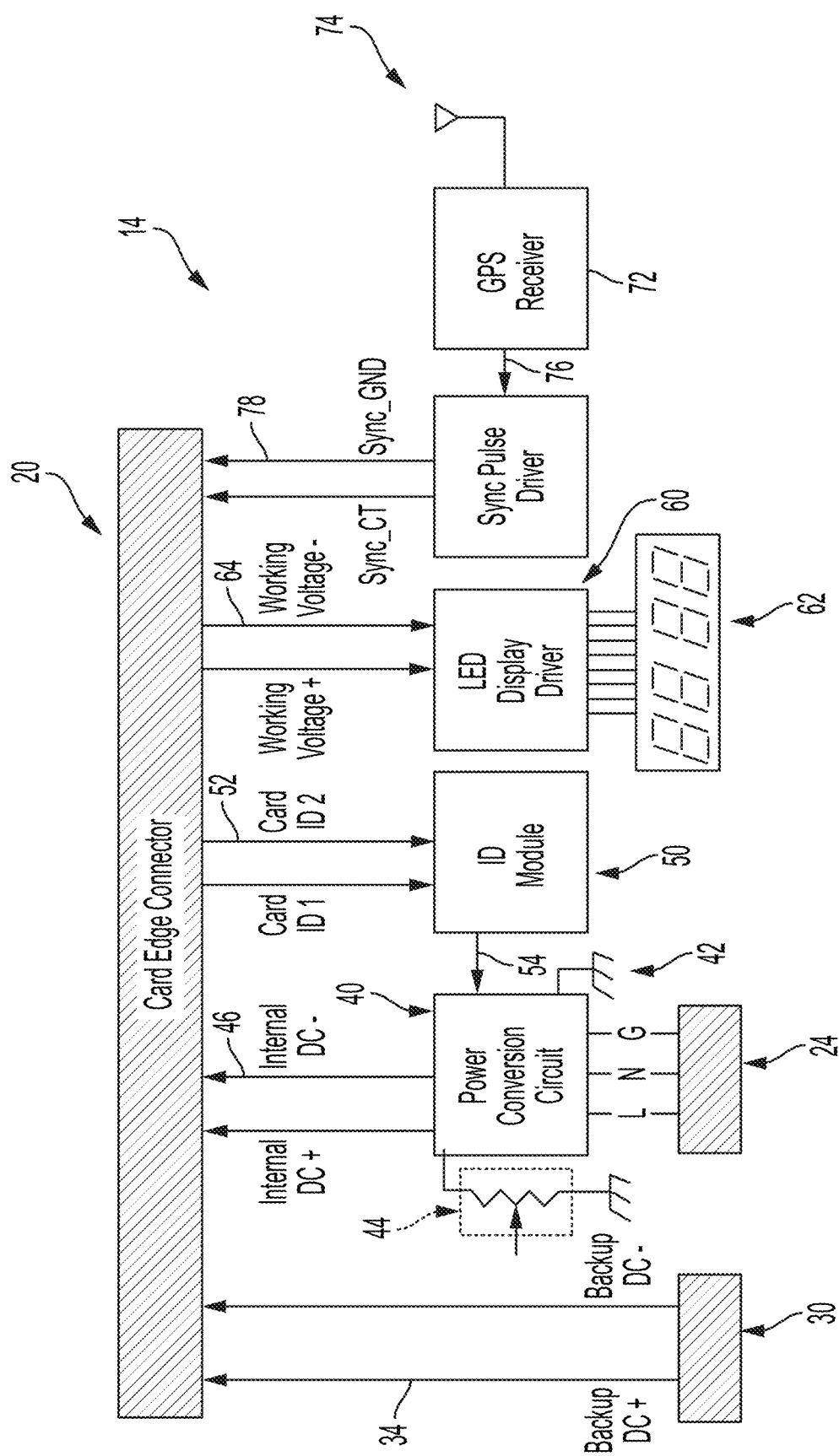
FIG. 2 is a schematic detailed block diagram of the specifics of the main chassis of FIG. 1 according to the teachings of the present invention.

The specifics of the main chassis component 14 are shown for example in FIG. 2. The back-up power source 32 is coupled to the back-up power connector 30, which is in turn coupled to the power card connector 20. The power card connector 20 can be any selected types of electrical connector, such as a card edge connector. The back-up power supplied by the back-up power source 32 can be direct current (DC) power. The main chassis 14 can also include a power conversion circuit or module 40 that is coupled at an input end to the AC power connector 26, which is in turn coupled to the main power source 28. The power conversion module 40 includes a chassis ground connection 42 and a voltage adjustment unit 44 for adjusting an output voltage level of the power conversion module 40. The adjustment unit 44 can be for example a potentiometer that adjusts the output voltage between selected levels, such as for example between a high voltage level of about 48V and a low voltage level of about 24V. The power conversion module 40 converts the input AC voltage supplied by the main power source 28 into an output DC voltage 46 at a selected voltage level as determined by the voltage adjustment unit 44 or by the specifics of the power conversion module 40. Further, the output voltage 46 of the power conversion module 40 can be isolated from the chassis ground 42 and can be manually adjusted using the voltage adjustment unit 44 by the end user within the defined voltage range.

The illustrated main chassis 14 also includes an identification circuit or module 50 that is configured to receive identification data 52 via the card edge connector 20 from the power supply subsystem 12. The identification data 52 can include any selected type of data sufficient to identify the modular power interface card 12 that is connected to the main chassis component 14. For example, the identification data 52 can digitally represent the voltage and polarity (e.g., positive or negative) of the modular power interface card 12. If the main chassis component 14 and the modular power interface card 12 are configured to include additional ID wires, then more detailed information can be provided. For example, the identification data 52 can include more detailed information on the output level in a serial digital format to allow fine tuning of the output voltage of the power conversion module 40. According to one embodiment, the identification module 50 can be configured to detect either a logic level high or a logic level low (e.g., an open circuit or a short circuit) relative to a system ground 110 in the modular power interface card 12 so as to identify the connected power card 12 and any associated capabilities.

The identification module 50 automatically generates in response to the identification data 52 a control signal 54 that is transmitted to the power conversion module 40, and in response the power conversion module 40 provides an output voltage in a range acceptable to the coupled power interface card 12. If no power interface card 12 is connected to the card edge connector 20, then the power conversion module 40 can be disabled.

The main chassis component 14 also includes a digital LED display 62 that is connected to an LED display driver 60. The display driver 60 is connected to voltage sensing inputs, such as the pin inputs 64, of the card edge connector 20, which sample the actual working voltage being supplied by the power supply subsystem 40 to the connected powered device 24 via the power supply subsystem 12. The display 62 can show the voltage, in volts, being used by the power supply subsystem 12 and which is supplied by the main chassis 14. Specifically, the main chassis 14 can supply power to the power supply subsystem 12 from either the back-up power source 32 or the main power source 28. If the main power source is operating and hence supplying power to the system 10, then the display 62 displays the voltage supplied by the main power source 28, since the power supplied thereby is typically greater than the power supplied by the back-up power source 32. If the power from the main power supply 28 is interrupted, then the back-up power source 32 supplies power to the power supply subsystem 12. If this occurs, then the display 62 displays the voltage supplied thereby. The LED display driver 60 includes circuitry to convert the analog voltage received from the power supply subsystem 12 to digital values suitable to be displayed on the display 62.

Further, the main chassis 14 includes a sync pulse driver module 70 that is coupled at an input end to a receiver module 72. The receiver module 72 is coupled to an antenna element 74. The antenna element 74 receives timing signals from selected devices, including for example from global positioning satellites. The antenna element 74 generates in response to the received timing signals an output signal that is received by the receiver module 72 and which in turn generates an output signal 76 that is received by the sync pulse driver module 70. The sync pulse driver module 70 generates in response to the receiver output signal 76 a sync output signal 78. The sync output signal is conveyed via the connector 20 to the modular power interface card 12. The sync output signal 78 generated by the sync pulse driver module 70 includes a pulse signal that is conveyed to and allows the modular power interface card 12 to align together any selected transmit times to avoid or eliminate electromagnetic interference between cell towers in a selected vicinity. More specifically, the sync pulse driver module 70 can generate a negative pulse in the sync output signal 78 that is injected into a center tap of a transformer unit 140 forming part of the modular power interface card 12. The connected powered device 24 can utilize this pulse information to synchronize an associated radio transmitter with other nearby transmitters to avoid interfering with other radio receiving equipment in the area.

Figure 3:
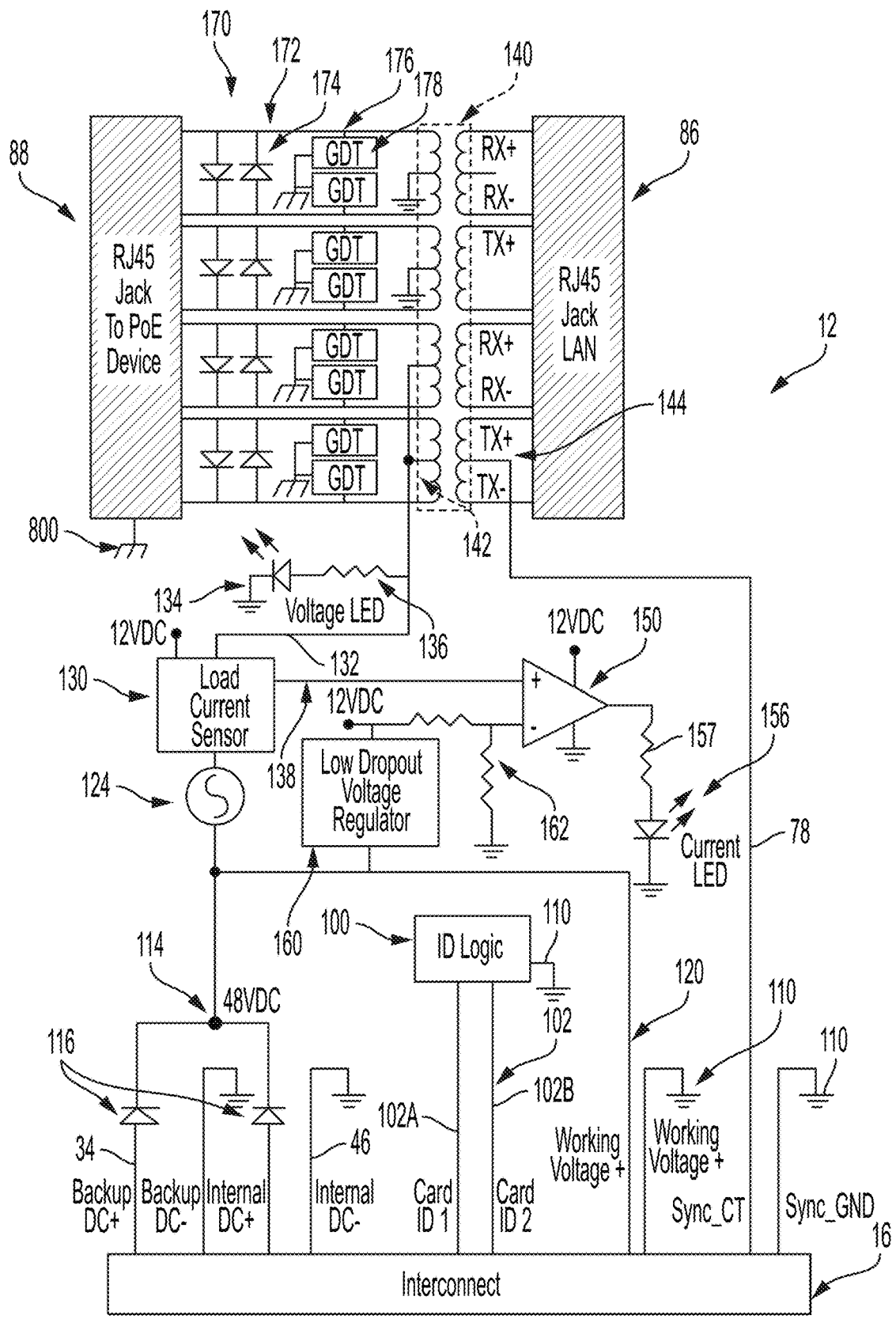
FIG. 3 is a schematic detailed block diagram of the modular power interface card with connections to the main chassis according to the teachings of the present invention.

As shown in FIG. 3, the modular power interface card 12 of the present invention can be coupled to the card edge connector 20 via the electrical interconnect 16. The power interface card 12 can be in the form of a modularized power supply card that can be connected to the main chassis component 14. The power interface card 12 can have associated therewith an ID logic module 100 that includes selected identification (ID) information. The ID information is conveyed by electrical pathways 102 to the interconnect 16, which in turn transmits the information to the ID module 50 via the card edge connector 20. The ID logic module 100 can include multiple electrical pathways which are either a logic high or a logic low (e.g., open circuit or connected to system ground 110). The electrical pathways provide information to the main chassis component 14 about the specific voltage levels (e.g., 12V, 24V or 48V) and selected ground levels (e.g., positive or negative) that are employed by the power interface card 12. The ID module 50 of the main chassis component 14 generates the output control signal 54 that is received by the power conversion module 40. The power conversion module 40 in response selects the voltage level employed by the power interface card 12 by converting the power supplied by the main power source 28 to the appropriate output power level (e.g., working voltage level). Alternatively, the voltage adjustment unit 44 can be employed to automatically or manually select the output voltage supplied by the power conversion module 40. The ID logic module 100 can employ multiple output electrical pathways 102A (Card ID 1) and 102B (Card ID 2) for transmitting information to the ID module 50. According to one embodiment, if pathway 102A has a voltage associated therewith of about 5V and the pathway 102B has a voltage associated therewith of about 5V, then the voltage output information is processed by the ID module 50 to generate the control signal 54, which provides instructions to the power conversion module 40 to generate a selected output working voltage at a selected working voltage level.

The illustrated power interface card 12 also includes an input power combination unit 114 for sensing and combining the power supplied thereto by main chassis component 14. Specifically, the output power signals 46 generated by the power conversion module 40 and the output power signals 34 from the back-up power source 32 are combined. According to one embodiment, the output power signals 34, 46 are combined using any suitable electrical or logical structure or device, such as for example by employing Schottky barrier diodes 116 that have a very low forward voltage drop. The higher magnitude voltage of the two power inputs (e.g., back-up power and main power) can be employed as the working voltage used by the power interface card 12 to power, for example, the network device 22 and the connected powered device 24. Under most operating circumstances, the main power source 28 supplies the higher voltage to the power interface card 12 via the power conversion module 40 and hence this voltage is employed as the working voltage 120. The working voltage 120 sampled from the input power end of the power interface card 12 is conveyed to the LED display driver 60, which displays the working voltage level on the display 62. In the current example, the working voltage level outputted from the power conversion module 40 and supplied by the main power source 28 is displayed on the display 62. If the main power and backup power sources are about equal in voltage level or magnitude, then the current sourced to the remote powered device can be split equally between the main power source 28 and the back-up power source 32. If the main power source 28 does not supply power to the power interface card 12, then the output power signal 34 of the back-up power source 32 is the working voltage 120 for the power interface card 12. The illustrated power interface card 12 can also include a fuse element, such as a blade style fuse 124, that is field replaceable by the end-user. The fuse element 124 provides over-current protection for the circuitry of the power interface card 12.

The power interface card 12 also includes a current sensor unit 130 for sensing or detecting the current supplied to the power interface card 12 by the power sources 28, 32. The output 132 of the current sensor unit 130 is coupled to the center tap 142 of a transformer unit 140. The current sensor output 132 can also be coupled to a voltage LED unit 134 that includes an input biasing resistor 136. The voltage LED 134 is actuated when input power is being supplied to the power interface card 12. The current sensor unit 130 also has a second output 138 that is also coupled to a threshold detector unit, such as for example an operational amplifier 150. Specifically, the output 138 is coupled to one input of the operational amplifier 150. The other input (e.g., inverting input) of the amplifier 150 is coupled to a voltage regulator unit 160 and associated detection circuitry 162 (e.g., resistive divider circuit). The voltage regulator unit 162 and the detection circuitry 162 generate a threshold signal that forms an input to the amplifier 150. If the current sensor output voltage 138 has a value that is greater than a value of the fixed threshold voltage at the inverting input, then the amplifier 150 generates a detection output signal that is transmitted to the current LED 156. The current LED 156 is actuated and hence is illuminated in response to receipt of the detection signal. The current LED 156 when illuminated indicates that the remote connected powered device 24 is consuming the minimum current. If the current sensor 130 generates an output voltage having a value that is below the value of the threshold signal, the current LED 156 is off, which indicates that the remote powered device is not consuming the minimum current.

The working voltage supplied from one or more of the power sources 28, 32 can be coupled to the illustrated transformer unit 140, which can include an isolation transformer, via the center taps 142, to an interface connector 86. The interface connector 86 can be any suitable interface connector, such as for example an RJ45 jack connector. The interface connector 86 can be coupled to the non-powered network device 22. The transformer unit 140 provides for a degree of electrical isolation between the input power sources (e.g., working voltage) and the network device 22 coupled to the power supply subsystem 12.

The sync pulse output signal 78 generated by the sync pulse driver module 70 is also coupled to the transformer unit 140 at the connection point 144. The sync pulse output signal 78 is conveyed via the connector 20 to the power interface card 12. The sync output signal 78 includes a pulse signal that allows the power interface card 12 to align together any selected transmit times to avoid or eliminate electromagnetic interference between cell towers in a selected vicinity.

The power interface card 12 can also include an isolation and protection unit 170 for protecting power interface card 12 and the connected powered devices from unwanted and deleterious voltage events, such as for example from lightning strikes and unwanted static charges. Specifically, the isolation and protection unit 170 can include a voltage suppression subunit 172 for protecting the power interface card 12 from low voltage type events, such as for example static charges. The voltage suppression subunit 172 can employ a plurality of connected voltage suppression diodes 174 for suppressing the low voltage type events. Specifically, the suppression diodes 174 can be transient voltage suppression type diodes which clamp the DC voltage to a level that does not damage the connected powered device 24. The suppression diodes can be arranged in a parallel configuration, as shown. The isolation and protection unit 170 can also include a high voltage protection subunit 176 for protecting the power interface card 12 and powered devices from high voltage type events, such as for example from lightning strikes. The high voltage protection subunit 176 can employ for example a plurality of connected gas discharge tubes 178 to perform the voltage protection. The gas discharge tubes 178 conduct the surge energy to the chassis ground 42 to avoid damaging the connected powered device 24. Specifically, the gas discharge tubes 178 can have extremely fast response times to the very high, short duration voltages associated with the high voltage type events (e.g., lightning strikes) and provide additional protection to the connected powered device 24. The isolation and protection unit 170 is coupled to an interface connector 88 for coupling the power supply subsystem 12 to the connected powered device 24. The interface connector 88 can also be, for example, an RJ45 jack.

According to the present invention, the modular power supply system 10 can include a main chassis component 14 for housing selected system components, such as shown for example in FIG. 2. The main chassis component 14 can include an enclosure made of any suitable material, such as metal (e.g., aluminum), a printed wiring assembly (PWA), an AC to DC power conversion circuit or module 40, and a digital LED display assembly (display driver 60 and display 62). More specifically, the main power source 26 can be connected via the AC power connector 26 to the power conversion module 40 on the PWA. The power conversion module 40 can provide a selected level of output power (e.g., working voltage level) to the power interface card 12 based on the ID data 52 received therefrom, and received specifically from the ID logic module 100. The power can be supplied over copper traces formed in the PWA. According to one practice, the power conversion module 40 can supply either 12V, 24V or 48V to the power interface card 12 based on the requirements thereof. The ID module 50 can generate in response to the ID data 52 a control signal 54 that instructs the power conversion module 40 to supply a selected voltage level to the power supply subsystem 12. Alternatively, the user can adjust the output voltage or power level (e.g., working voltage level) supplied to the power interface card 12 from the power conversion module 40 with the voltage adjustment unit 44. According to one embodiment, the output power voltage level from the power conversion module 40 can be manually adjusted between any selected voltage levels, such as between about 42V and about 55V, as required by the power interface card 12. The DC output voltage from the power conversion module 40 is connected directly to the card edge connector 20 using copper traces on the PWA. The back-up power source 32 is coupled to the connector 20 by way of the back-up power connector 30.

The illustrated main chassis component 14 also includes the LED display driver 60 and associated digital display 62 to form an LED display assembly. The LED display assembly is mounted in the main chassis and connected to the PWA using a wire to board connector. The wire to board connector is connected to the working voltage sense inputs 64 from the card edge connector 20 using copper traces on the PWA. When the power interface card 12 is connected to the main chassis component 14 at the card edge connector 20, the working voltage supplied to the power interface card 12 is fed back to the main chassis component 14 and powers the LED display assembly. The LED display driver 60 also serves to measure the working voltage and convert the voltage to a numeric value (e.g., working voltage level) for display on the digital display 62. If the power interface card 12 is not present or if the input power combination unit or circuit 114 is not functional, the LED display 62 will be off. The AC ground is connected to the chassis ground 42. The main chassis component 14 also includes a sync pulse driver module 70 that receives GPS signals from a GPS receiver, and then generates the syn pulse signal 78 that is coupled to the output side of the transformer 140 at, for example, connection point 144.

The modular power supply system 10 also includes a removeable and replaceable power interface card 12 that also includes a PWA with a card edge interconnect 16 consisting of gold plated copper traces (e.g., gold fingers), which plugs into the main chassis card edge connector 20 and is secured with one or more hand tightened fasteners to the main chassis component 14. The modular power interface card 12 has main and backup DC voltage input traces 34, 46 which are connected to an input power combination unit 114 that employs low loss Schottky diodes 116 for combining the voltages from the back-up and main power sources 32 and 28, respectively. The combined voltage is routed through a current limiting fuse 124 that is user replaceable. The fuse 124 provides the circuit with overcurrent protection. After the fuse 124, a current sensor 130 senses the current from the working voltage and generates an output signal that is introduced to a threshold detection unit, which can include an operational amplifier 150. Specifically, the output signal of the current sensor 130 is introduced to the positive input of the operational amplifier 150. The voltage regulator unit 160 (e.g., a low-dropout voltage regulator circuit) can include a resistor network 162 to measure the current and produce an output voltage proportional to the magnitude of the current being sourced. That is, the voltage regulator unit 160 and voltage divider circuit establish a threshold voltage or current level that is provided to the negative or inverted input of the operational amplifier 150. The voltage that is inputted to the positive input of the operational amplifier is compared to the fixed threshold voltage which represents the minimum current level (e.g., 250 milliamps) required to determine if the remote powered device is operational. The fixed value is set by the resistive voltage divider network 162 that employs the output of voltage regulator unit 160 as an accurate voltage source. If the load is consuming at least the minimum current level, the operational amplifier 150 drives to a positive rail of 12V, which then serves to drive or illuminate the LED 156 that employs a single bias resistor 157.

Further, a separate LED 134 is biased by a single input resistor 136 and is connected to the fused working voltage. If the working voltage is present, then the LED 134 is actuated or illuminated. If the fuse 124 is blown or the working voltage is not present, then the LED 134 will not illuminate. The fused working voltage is then connected to the center tap 142 of each positive and negative transformer output of the transformer unit 140, and then to the interface connector 86 in order to spread the current evenly to each pin of the RJ45 jack. The gas discharge tubes 178 of the high voltage protection subunit 176 are connected from each twisted wire pair to earth ground. The gas discharge tubes 178 have low capacitance and do not affect the ethernet signal which is present on the wires. The gas discharge tubes 178 and the transient voltage suppressor diodes 174 of the voltage suppression subunit 172 only conduct to ground when a high voltage condition exists on the twisted wire pair and automatically open again after the high voltage condition is removed allowing for continued operation of the system 10. The isolation and protection unit 170 couple the working voltage to the interface interconnect 88, which in turn allows the power supply subsystem 12 to communicate with the network devices 24.

The main chassis component 14 thus includes an internally regulated AC-DC power supply, an adjustable output voltage, a DC back-up power connection, and an earth grounding access point. The power supply subsystem 12 can handle a wide voltage range, employs a transformer based PoE interface connectors, employs multiple different LEDs 134, 156 for sensing whether power is being supplied by the power supply subsystem 12 and whether a connected device is drawing power, employs a field replaceable fuse 124, employs an isolation and protection unit 170 that has a series of diodes and gas discharge tubes for protecting connected devices, and the power supply subsystem is formed as a field replaceable and pluggable power card.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and desired to be secured by Letters Patent is:

1. A modular power supply system for supplying power to a connected device, comprising
    a power interface card having
        an identification logic module for storing identification data associated with the power interface card,
        a fuse element for providing over-current protection from a working voltage,
        a current sensor unit for detecting current supplied to the power interface card and for generating a sensor output signal representative of the detected current,
        a voltage regulator unit for generating in response to the working voltage a threshold signal,
        a threshold detection unit coupled to the current sensor unit and to the voltage regulator unit for comparing the sensor output signal to the threshold signal, wherein the threshold detector unit generates a detection output signal when a value associated with the sensor output signal is greater than a value associated with the threshold signal,
        a first LED coupled to an output of the threshold detection unit and is configured to be actuated in response to the detection output signal, wherein the first LED when actuated is indicative of power being supplied by the power interface card,
        a transformer unit coupled to the current sensor unit for receiving the working voltage and for electrically isolating a non-powered network device from the working voltage while providing power to the connected device, and
        an isolation and protection unit for protecting the power supply system from selected types of voltage events, and
    a main chassis component for supplying the working voltage to the power interface card having
        an identification module for receiving the identification data from the identification logic module and for generating a power control signal,
        a power conversion module for converting power supplied by a main power source to the working voltage, wherein the power conversion module in response to the power control signal outputs the working voltage at the selected working voltage level,
        a display driver for sensing the working voltage level of the power interface card, and
        a display coupled to the display driver for displaying the working voltage level,
    wherein the power interface card is removably and replaceably coupled to the main chassis component.

2. The power supply system of claim 1, wherein the main chassis component further comprises a voltage adjustment unit coupled to the power conversion module for adjusting the working voltage level generated by the power conversion module.

3. The power supply system of claim 2, wherein the main chassis component further comprises a sync pulse driver module configured for receiving a receiver output signal and in response generating a sync output signal that is coupled to the transformer unit of the power interface card for placing a pulse signal on an output of the transformer so as to enable the power interface card to synchronize one or more signals of one or more radio transmitters within a selected distance of the power interface card.

4. The power supply system of claim 1, wherein the identification data comprises working voltage level requirements and ground voltage level requirements.

5. The power supply system of claim 1, wherein the power interface card further comprises an input power combination unit configured so as to receive and combine power supplied from a main power source and a back-up power source via the main chassis component.

6. The power supply system of claim 5, wherein the input power combination unit comprises a first Schottky barrier diode configured so as to be coupled to the power supplied by the back-up power source and a second Schottky barrier diode configured so as to be coupled to the power supplied by the main power source.

7. The power supply system of claim 5, wherein the power interface card further comprises a second LED unit coupled to the current sensor unit, wherein the second LED is actuatable when power is supplied to the connected device.

8. The power supply system of claim 7, wherein the second LED unit comprises an input biasing resistor.

9. The power supply system of claim 7, wherein the threshold detector unit comprises an operational amplifier.

10. The power supply system of claim 9, wherein the transformer unit has a center tap that is coupled to the current sensor unit.

11. The power supply system of claim 10, wherein the isolation and protection unit comprises
    a voltage suppression subunit for protecting the power supply system from a low voltage type event, and
    a high voltage protection subunit for protecting the power supply subsystem from a high voltage type event.

12. The power supply system of claim 11, wherein the low voltage type event includes a static charge, and the high voltage type event includes a lightning strike.

13. The power supply system of claim 11, wherein the voltage suppression subunit comprises a plurality of connected voltage suppression diodes for suppressing the low voltage type event.

14. The power supply system of claim 13, wherein the high voltage protection subunit comprises a plurality of connected gas discharge tubes to perform the voltage protection.

15. A modular power interface card suitable for use with a power supply system for supplying a working voltage to a connected device, comprising
    an identification logic module for storing identification data associated with the power interface card, a fuse element for providing over-current protection from the working voltage, a current sensor unit for detecting current supplied to the power interface card and for generating a sensor output signal representative of the detected current, a voltage regulator unit for generating in response to the working voltage a threshold signal, a threshold detection unit coupled to the current sensor unit and to the voltage regulator unit for comparing the sensor output signal to the threshold signal, wherein the threshold detection unit generates a detection output signal when a value associated with the sensor output is greater than a value associated with the threshold signal, a first LED coupled to an output of the threshold detection unit and is configured to be actuated in response to the detection output signal, wherein the first LED when actuated is indicative of power being supplied by the power interface card, a transformer unit coupled to the current sensor unit for receiving the working voltage and for electrically isolating a non-powered network device from the working voltage, and an isolation and protection unit for protecting the power supply system from selected voltage events.

16. The modular power interface card of claim 15, wherein the identification data comprises working voltage level requirements and ground voltage level requirements.

17. The modular power interface card of claim 15, further comprising an input power combination unit configured so as to receive and combine power that is received by the system.

18. The modular power interface card of claim 17, wherein the input power combination unit comprises a first Schottky barrier diode configured so as to be coupled to power supplied by a back-up power source and a second Schottky barrier diode configured so as to be coupled to power supplied by a main power source.

19. The modular power interface card of claim 17, further comprising a voltage LED unit coupled to the current sensor unit, wherein the voltage LED is actuatable when power is supplied thereto.

20. The modular power interface card of claim 15, wherein the threshold detection unit comprises an operational amplifier.

21. The modular power interface card of claim 20, wherein the transformer unit has a center tap that is coupled to the current sensor unit.

22. The modular power interface card of claim 21, wherein the isolation and protection unit comprises a voltage suppression subunit for protecting the power supply subsystem from a low voltage event, and a high voltage protection subunit for protecting the power supply system from a high voltage event.

23. The modular power interface card of claim 22, wherein the low voltage event includes a static charge, and the high voltage event includes a lightning strike.

24. The modular power interface card of claim 23, wherein the voltage suppression subunit comprises a plurality of connected voltage suppression diodes for suppressing the low voltage event.

25. The modular power interface card of claim 24, wherein the high voltage protection subunit comprises a plurality of connected gas discharge tubes to perform the voltage protection.

26. A main chassis component of a power supply system for supplying a working voltage to a connected device, comprising an identification module for receiving identification data associated with an attached power interface card and for generating a power control signal, a power conversion module for converting power supplied by a main power source to the working voltage, wherein the power conversion module in response to the power control signal outputs the working voltage at a selected working voltage level, a display driver for sensing the working voltage level of the power supply system, and a display coupled to the display driver for displaying the working voltage level.

27. The main chassis component of claim 26, further comprising a voltage adjustment unit coupled to the power conversion module for adjusting the working voltage level generated by the power conversion module.

28. The main chassis component of claim 27, further comprising a sync pulse driver module configured for receiving a receiver output signal and in response generating a sync output signal that is configured to be coupled to a transformer for placing a pulse signal on an output of the transformer so as to synchronize one or more radio transmitters within a selected distance of the main chassis component.

* * * * *